(12) United States Patent
Liang

(10) Patent No.: US 7,307,842 B1
(45) Date of Patent: Dec. 11, 2007

(54) HEAT SINK ASSEMBLY HAVING RETAINING DEVICE WITH RELATIVELY BETTER HEAT DISSIPATION EFFECTIVENESS

(75) Inventor: Robert Liang, Taoyuan County (TW)

(73) Assignee: Malico Inc., Yang Mei, Taoyuan County (TW)

( * ) Notice: Subject to any disclaimer, the term of this patent is extended or adjusted under 35 U.S.C. 154(b) by 0 days.

(21) Appl. No.: 11/427,878

(22) Filed: Jun. 30, 2006

(51) Int. Cl.
*H05K 7/20* (2006.01)
*F28D 15/00* (2006.01)

(52) U.S. Cl. ............ 361/710; 361/704; 361/709; 165/104.33; 165/185; 24/458

(58) Field of Classification Search .......... 361/704, 361/707, 709–710, 719; 165/80.3, 104.33, 165/185; 24/457–458; 257/706–707, 719, 257/722
See application file for complete search history.

(56) References Cited

U.S. PATENT DOCUMENTS 6,153,932 A * 11/2000 Liang .................. 257/712
6,476,484 B1 * 11/2002 Liang .................. 257/718
6,644,396 B2 * 11/2003 Liang .................. 165/185
6,728,103 B1 * 4/2004 Smedberg ............ 361/703
2006/0198107 A1 * 9/2006 Azar et al. ........... 361/704

* cited by examiner

*Primary Examiner*—Jayprakash Gandhi
*Assistant Examiner*—Robert J. Hoffberg
(74) *Attorney, Agent, or Firm*—Alston & Bird LLP

(57) ABSTRACT

The proposed heat sink assembly mounted on a heat source includes a heat sink including a base with a top surface and a plurality of fins, and a retaining device including a frame with a top, a hole with a size larger than that of the base, an elastic rod connected with the frame, extending into the hole and having and end portion protruding towards the hole and pushing the heat sink and a plurality of retaining plates extending downwards from one of the first two and the second two opposite sides. Each of the retaining plates has a barb mounting the heat sink on the heat source and making the top surface raise through the hole to a same height of the top to facilitate the heat dissipation.

11 Claims, 6 Drawing Sheets

HEAT SINK ASSEMBLY HAVING RETAINING DEVICE WITH RELATIVELY BETTER HEAT DISSIPATION EFFECTIVENESS

FIELD OF THE INVENTION

The present invention relates to a heat sink assembly including a heat sink and a retaining device and more particularly to a heat sink retaining device having a frame, which reaches the same height as that of a base of the heat sink when the heat sink is mounted on a heat source, to facilitate the heat dissipation.

BACKGROUND OF THE INVENTION

Nowadays, many electronic devices such as chipsets and RAMs would generate large amounts of heat during the operation. The heat must be removed efficiently. Otherwise, malfunction or damage may result. Due to the increasingly requirements in heat dissipation, various kinds of heat sink assemblies are proposed so as to dissipate the heat generated by the electronic devices more effectively.

Please refer to FIG. 1, which is an exploded perspective view of a conventional heat sink assembly 1 having a heat sink 11 and a retaining device 12, which is employed to mount the heat sink 11 on a first top 210 of a chipset assembly 2 (a heat source) so as to dissipate the heat generated by the heat source. The chipset assembly 2 further includes a chipset 21 having the first top 210, a substrate 22 and a PC board 23. The heat sink 11 further includes a plurality of fins 111 and a base 112 having a top surface 1121 and a base plate 1122. The retaining device 12 further includes a frame 121 having a second top 1210, four side portions 1211 and a hole 1212 with a size smaller than that of the base 112, two retaining plates 122 each with a barb 1221 mounting the heat sink 11 on the first top 210 of the chipset assembly 2, four elastic rods 123 extending inwards the hole from the second top 1210 of the frame 121 and each with a end portion 1231 bending towards the hole 1212 and pressing the heat sink 11, two positioning columns 124 extending downwards from the frame 121 and positioning the heat sink 11.

FIG. 2 is a schematic diagram showing that the conventional heat sink assembly 1 is mounted on the first top 210 of the chipset assembly 2. FIGS. 3(a) and 3(b) are a transverse cross sectional view of the conventional heat sink assembly 1 and the chipset assembly 2 of FIG. 2 and a longitudinal cross sectional view of the conventional heat sink assembly 1 and the chipset assembly 2 of FIG. 2 respectively. Referring to FIGS. 3(a) and 3(b), notice that the frame 121 would cover an outer portion of the base 112 such that no fin could be formed on the outer portion of the top surface 1121 of the base 112, which is covered by the frame 121 firstly. Thus, relatively the heat dissipation effectiveness of the heat sink assembly 1 would be lower since the heat sink 11 has less number of fins 111 secondly. And the airflow flows through the plurality of gaps 1111 formed therebetween the plurality of fins 111 would be blocked by the frame 121, which will dramatically damp the heat dissipation effectiveness of the heat sink assembly 1 especially when the height of the plurality of fins is relatively lower as is the case of FIG. 2 thirdly. These are the main drawbacks of the above-mentioned conventional heat sink assembly 1.

Keeping the drawbacks of the prior art in mind, and employing experiments and research full-heartily and persistently, the applicant finally conceived a heat sink assembly having a retaining device with relatively better heat dissipation effectiveness.

SUMMARY OF THE INVENTION

It is therefore an object of the present invention to propose a heat sink assembly having a retaining device with relatively better heat dissipation effectiveness.

According to a first aspect of the present invention, the heat sink assembly dissipating a heat from a heat source having a first top includes a heat sink including a base having a top surface and a plurality of fins formed on the top surface and forming a plurality of gaps therebetween and a retaining device including a frame having a second top and a hole with a size larger than that of the base, an elastic rod connected with the frame, extending into the hole and having an end portion protruding towards the hole, falling into one of the plurality of gaps and pushing the heat sink and a plurality of retaining plates extending downwards from the frame and each having a barb mounting the heat sink on the first top and making the top surface raise through the hole only to a same height of the second top.

Preferably, the elastic rod is extending along one of the plurality of gaps and bending towards the hole at the end portion.

Preferably, the retaining device further includes two bottom plates, the frame further includes a first pair and a second pair of opposite sides, two of the plurality of retaining plates extend from the first pair of opposite sides, and the two bottom plates position the heat sink and extend downwards from the second pair of opposite sides.

Preferably, the retaining device further includes two bottom plates, the frame further includes a first pair and a second pair of opposite sides, two of the plurality of retaining plates extend from the second pair of opposite sides, and the two bottom plates position the heat sink and extend downwards from the first pair of opposite sides.

Preferably, the elastic rod, the plurality of retaining plates and the two bottom plates are all integrally formed with the frame.

Preferably, the base further includes a base plate.

Preferably, a distance from the second top to the barb equals to a sum of a thickness of the base plate and a thickness of the first top.

Preferably, a distance from the second top to the barb equals to a sum of a thickness of the base and a thickness of the first top.

Preferably, the frame and the plurality of gaps at the same height could facilitate a dissipation of the heat generated by the heat source when the heat sink is mounted on the first top.

Preferably, the frame further includes a plurality of bottom plates positioning the heat sink and extending downwards from the frame.

According to a second aspect of the present invention, the heat sink assembly dissipating a heat from a heat source having a first top includes a heat sink including a base having a top surface and a plurality of fins formed on the top surface and forming a plurality of gaps therebetween and a retaining device including a frame having a second top and a hole with a size larger than that of the base, an elastic rod connected with the frame, extending into the hole and having an end portion protruding towards the hole, falling into one of the plurality of gaps and pushing the heat sink and a plurality of retaining plates extending downwards from the frame and each having a barb mounting the heat sink on the first top and making the top surface raise through the hole only to a height relatively higher than that of the second top.

According to a third aspect of the present invention, the heat sink assembly dissipating a heat from a heat source having a first top includes a heat sink including a base having a top surface and a plurality of fins formed on the top surface and forming a plurality of gaps therebetween and a retaining device including a frame having a second top and a hole with a size larger than that of the base, an elastic rod connected with the frame, extending into the hole and having an end portion protruding towards the hole, falling into one of the plurality of gaps and pushing the heat sink and a plurality of retaining plates extending downwards from the frame and each having a barb mounting the heat sink on the first top.

Preferably, the top surface rises through the hole only to a height relatively lower than that of the second top.

The present invention may best be understood through the following descriptions with reference to the accompanying drawings, in which:

DETAILED DESCRIPTION OF THE PREFERRED EMBODIMENT

Figure 1:
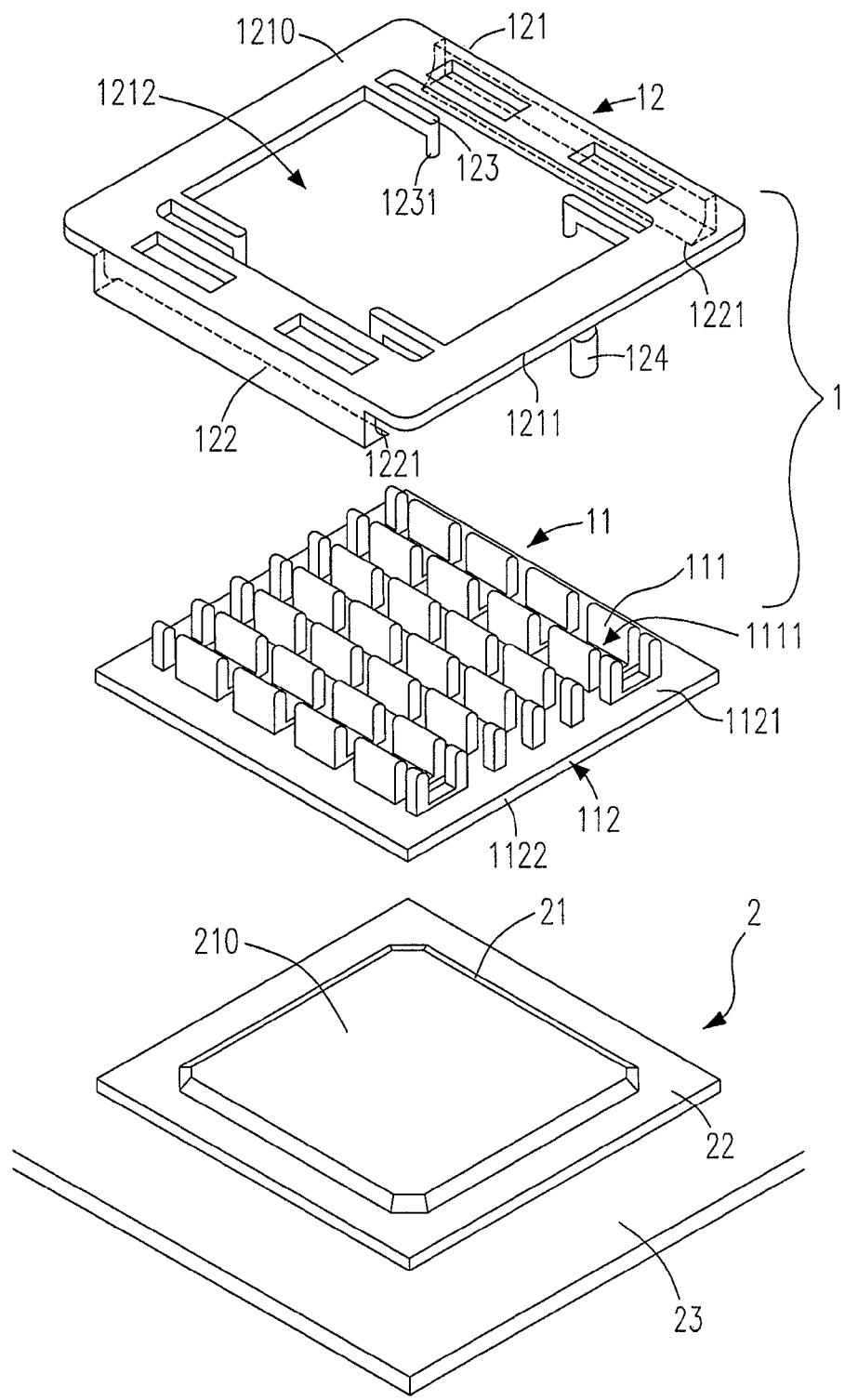
FIG. 1 is an exploded perspective view of a conventional heat sink assembly and a chipset assembly in the prior art.
Figure 2:
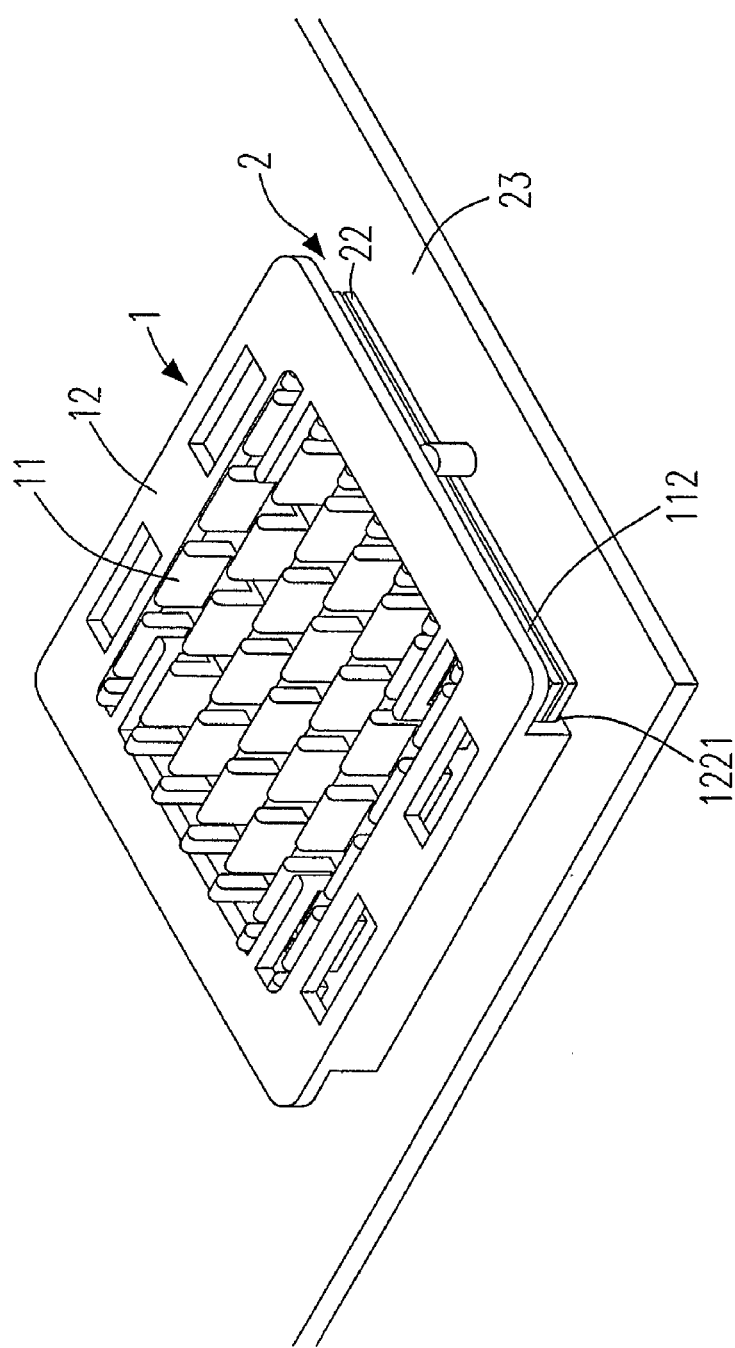
FIG. 2 is a schematic diagram showing that the conventional heat sink assembly and the chipset assembly of FIG. 1 are assembled.
Figure 3A:
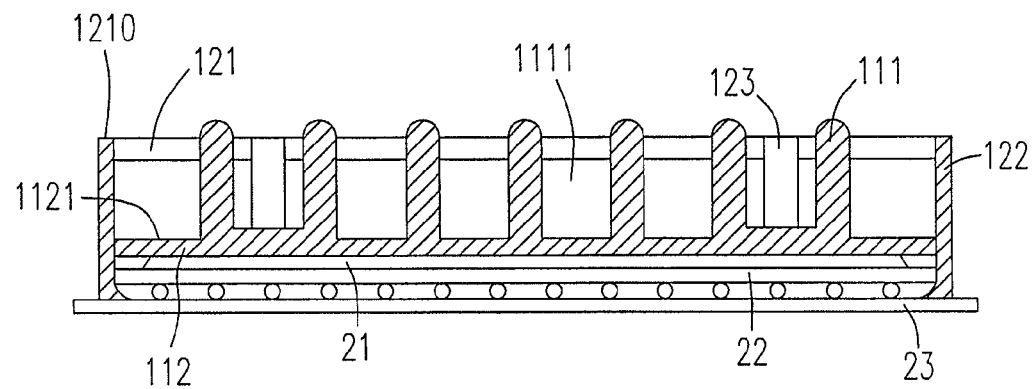
FIG. 3(a) is a transverse cross sectional view of the conventional heat sink assembly and the chipset assembly of FIG. 2.
Figure 3B:
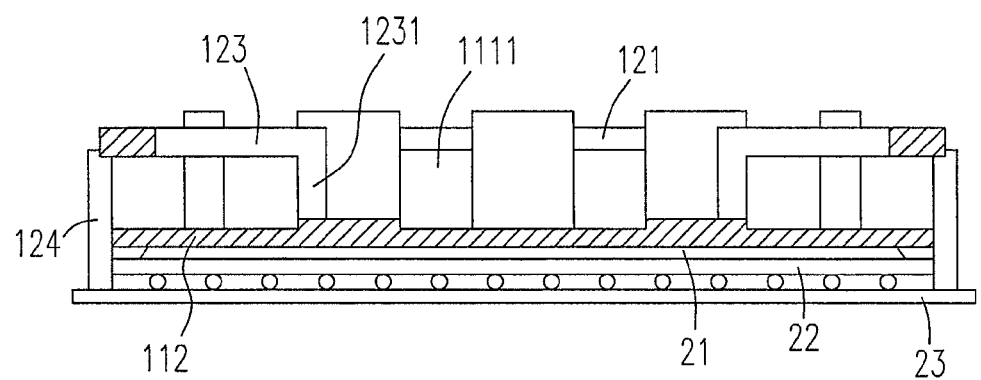
FIG. 3(b) is a longitudinal cross sectional view of the conventional heat sink assembly and the chipset assembly of FIG. 2.
Figure 4:
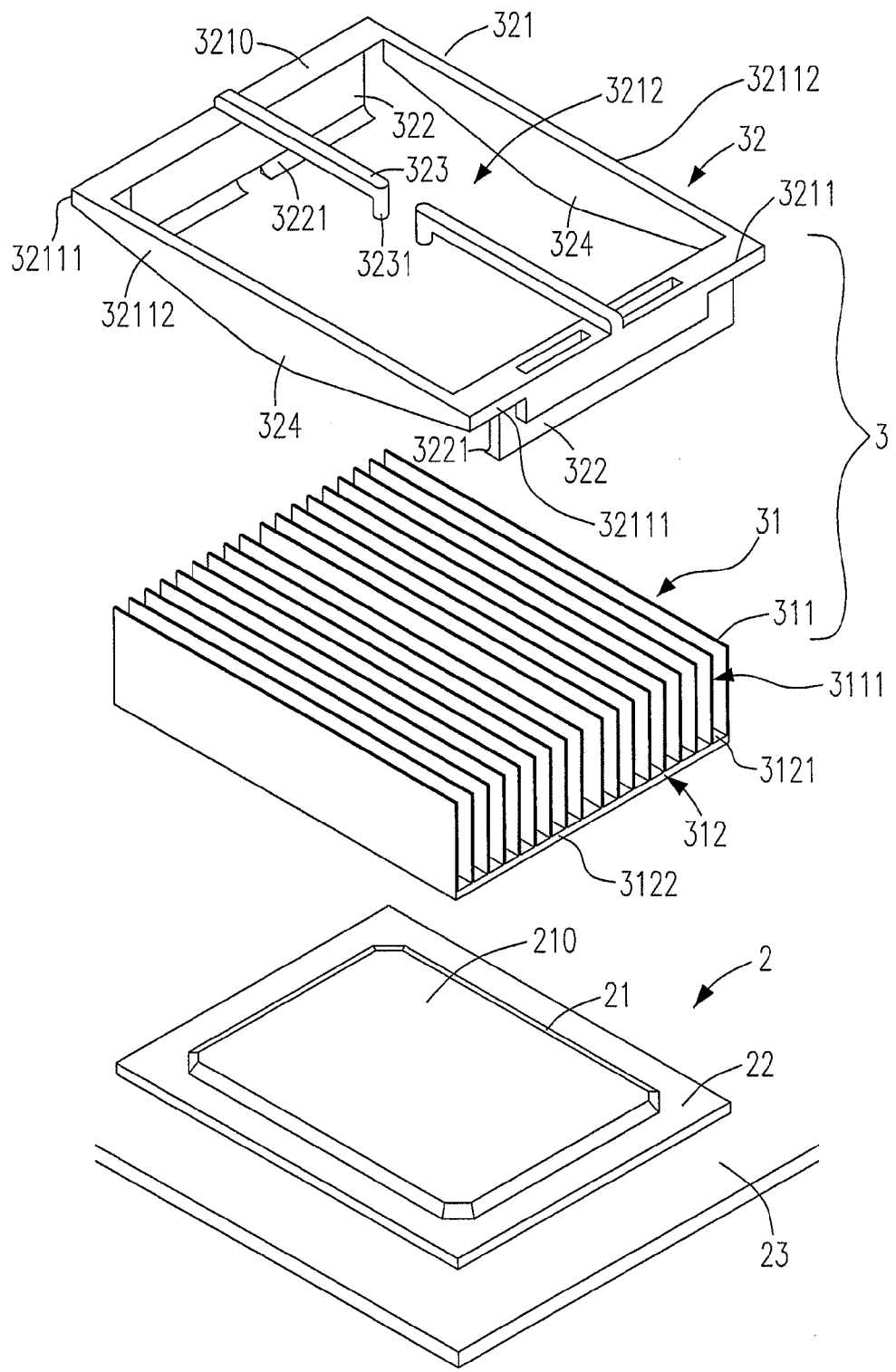
FIG. 4 is an exploded perspective view of a preferred embodiment of the proposed heat sink assembly and a chipset assembly in the present invention.

Please refer to FIG. 4, which shows an exploded perspective view of a preferred embodiment of the proposed heat sink assembly 3 having a heat sink 31 and a retaining device 32, which is employed to mount the heat sink 31 on a first top 210 of a chipset assembly 2 in the present invention. The chipset assembly 2 includes the first top 210, a chipset 21, a substrate 22 and a PC board 23. The heat sink 31 further includes a plurality of fins 311 and a base 312 having a top surface 3121 and a base plate 3122. The retaining device 32 further includes a frame 321 having a second top 3210, four side portions 3211 and a hole 3212 with a size larger than the base 312. The four side portions 3211 further include a first two and a second two opposite sides (32111 and 32112 respectively) and surround the hole 3212. The retaining device 32 further includes two retaining plates 322 each with a barb 3221 mounting the heat sink 31 on the first top 210 of the chipset assembly 2, two elastic rods 323 connected with the frame 321, extending inwards into the hole 3212 and each with a end portion 3231 protruding towards the hole 3212, falling into one of the plurality of gaps 3111 formed therebetween the plurality of fins 311 and pressing the heat sink 31 and two bottom plates 324 positioning the heat sink 31. The two retaining plates 322 are extending downwards from one of the first two and the second two opposite sides (32111 and 32112), and the two barbs 3221 are employed to mount the heat sink 31 on the first top 210 and make the top surface 3121 raise through the hole 3212 to the same height of the second top 3210 and position the heat sink 31 so as to facilitate the dissipation of a heat generated by the chipset assembly 2, which is a heat source (see FIG. 5). Notice that there are also many fins formed on an outer portion of the top surface 3121 of the base 312 and the frame 321 having the second top 3210 located at the same height as the top surface 3121 of the base 312 would not block the airflow flowing through the plurality of gaps 3111 formed therebetween the plurality of fins 311. Thus, relatively the proposed heat sink assembly 1 having more fins and airflows for cooling could dissipate the heat generated by the heat source, the chipset assembly 2, more effectively.

Figure 5:
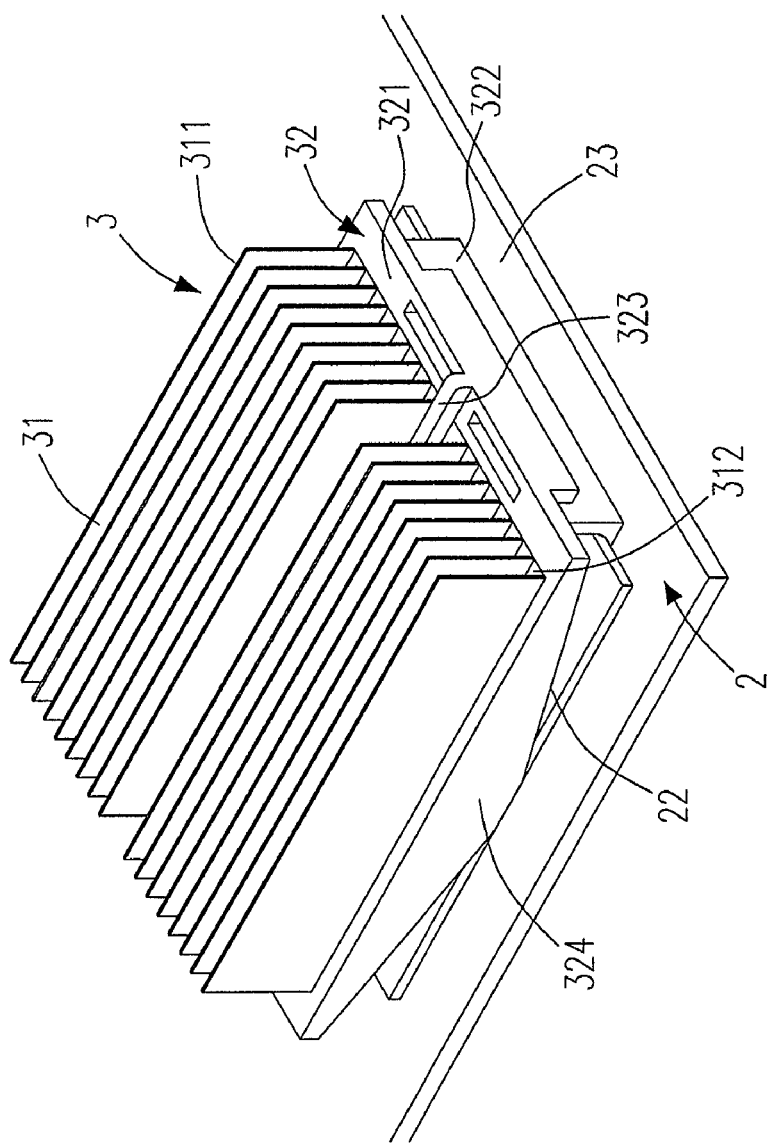
FIG. 5 is a schematic diagram showing that the proposed heat sink assembly and the chipset assembly of FIG. 4 are assembled.

FIG. 5 is a schematic diagram showing that the proposed heat sink assembly 3 having the heat sink 31 and the retaining device 32 is mounted on the first top 210 of the chipset assembly 2.

Figure 6A:
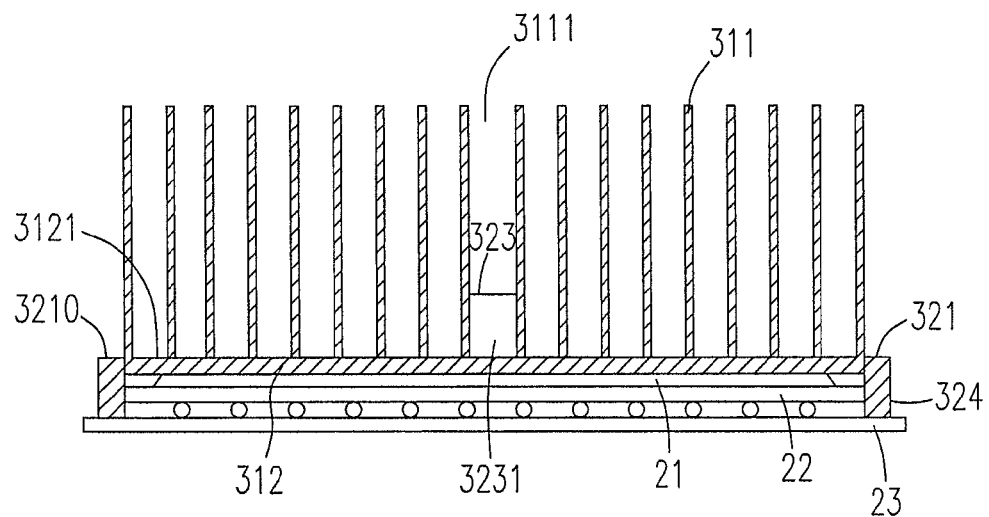
FIG. 6(a) is a transverse cross sectional view of the preferred embodiment of the proposed heat sink assembly and the chipset assembly of FIG. 5.
Figure 6B:
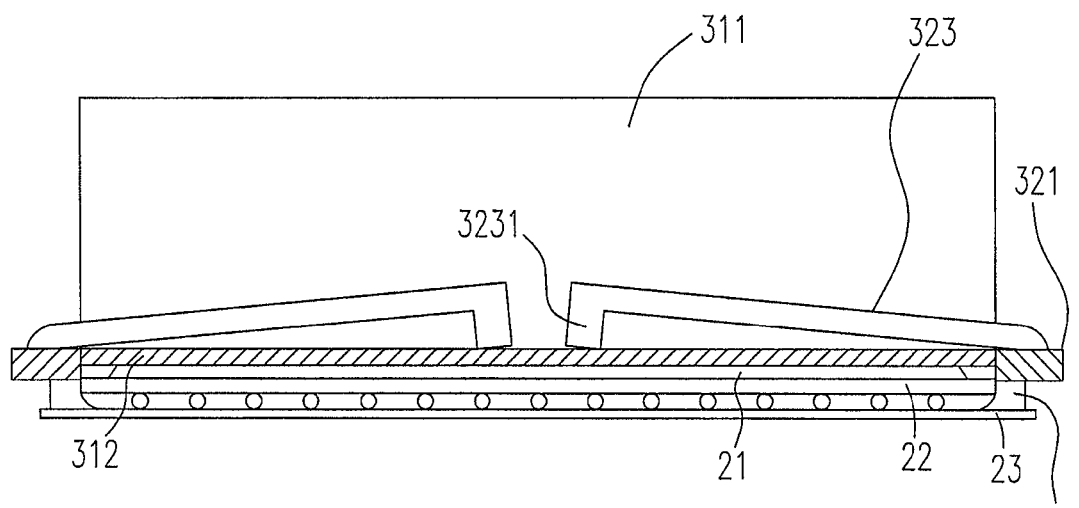
FIG. 6(b) is a longitudinal cross sectional view of the preferred embodiment of the proposed heat sink assembly and the chipset assembly of FIG. 5.

FIG. 6(a) shows a transverse cross sectional view of the preferred embodiment of the proposed heat sink assembly 3 and the chipset assembly 2 of FIG. 5, and FIG. 6(b) is a longitudinal cross sectional view of the preferred embodiment of the proposed heat sink assembly 3 and the chipset assembly 2 of FIG. 5 respectively.

In conclusion, the present invention would effectively improve the drawbacks of the prior art, and further enhance the heat transfer since each of the two retaining plates 322 has a barb 3221 mounting the heat sink 31 on the first top 210 and making the top surface 3121 raise through the hole 3212 to the same height of the second top 3210 such that the plurality of fins 311 could be formed on the outer portion of the top surface 3121 of the base 312, which is not covered by the frame 321 anymore, and the airflow flows through the plurality of gaps 3111 formed therebetween the plurality of fins 311 would not be blocked by the frame 321. The proposed heart sink assembly 3 including the heat sink 31 and the retaining device 32 would have a relatively better heat dissipation effectiveness. Thus, the present invention has its value in the industry, and the purpose of developing the present invention is achieved.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What is claimed is:

1. A heat sink assembly dissipating heat from a heat source having a first top, comprising: a heat sink, comprising: a base having a top surface; and a plurality of fins formed on said top surface and forming a plurality of gaps therebetween; and a retaining device, comprising: a frame having a second top and a hole with a size larger than that of said base; an elastic rod connected with said frame and extending inwardly therefrom, and having an end portion protruding towards said hole, falling into one of said plurality of gaps and pushing said heat sink; and a plurality of retaining plates extending downwards from said frame and each having a barb mounting said heat sink on said first top.

2. The assembly according to claim 1, wherein said elastic rod is extending along one of said plurality of gaps and bending towards said hole at said end portion.

3. The assembly according to claim 1, wherein said retaining device further comprises two bottom plates, said frame further comprises a first pair and a second pair of opposite sides, two of said plurality of retaining plates extend from said first pair of opposite sides, and said two bottom plates position said heat sink and extend downwards from said second pair of opposite sides.

4. The assembly according to claim 1, wherein said retaining device further comprises two bottom plates, said frame further comprises a first pair and a second pair of opposite sides, two of said plurality of retaining plates extend from said second pair of opposite sides, and said two bottom plates position said heat sink and extend downwards from said first pair of opposite sides.

5. The assembly according to claim 4, wherein said elastic rod, said plurality of retaining plates and said two bottom plates are all integrally formed with said frame.

6. The assembly according to claim 1, wherein said base further comprises a base plate.

7. The assembly according to claim 6, wherein a distance from said second top to said barb equals to a sum of a thickness of said base plate and a thickness of said first top.

8. The assembly according to claim 1, wherein a distance from said second top to said barb equals to a sum of a thickness of said base and a thickness of said first top.

9. The assembly according to claim 1, wherein said frame and said plurality of gaps at said same height could facilitate a dissipation of said heat generated by said heat source when said heat sink is mounted on said first top.

10. The assembly according to claim 1, wherein said frame further comprises a plurality of bottom plates positioning said heat sink and extending downwards from said frame.

11. The assembly according to claim 1, wherein said top surface raise through said hole only to a substantially same height of said second top.

* * * * *

UNITED STATES PATENT AND TRADEMARK OFFICE
CERTIFICATE OF CORRECTION

PATENT NO. : 7,307,842 B1 Page 1 of 1
APPLICATION NO. : 11/427878
DATED : December 11, 2007
INVENTOR(S) : Liang It is certified that error appears in the above-identified patent and that said Letters Patent is hereby corrected as shown below:

Title page,

In the ABSTRACT, line 6,

"and having and end portion" should read --and having an end portion--.

Column 6,

Line 21, "raise" should read --rises--.

Signed and Sealed this

Sixth Day of May, 2008

JON W. DUDAS
*Director of the United States Patent and Trademark Office*